(12) United States Patent
Lin et al.

(10) Patent No.: US 12,713,855 B2
(45) Date of Patent: Aug. 18, 2026

(54) SEMICONDUCTOR DEVICE AND SEMICONDUCTOR MANUFACTURING METHOD THEREOF

(71) Applicant: TAIWAN SEMICONDUCTOR MANUFACTURING COMPANY, LTD., Hsinchu (TW)

(72) Inventors: Yung-Chi Lin, Hsinchu (TW); Tsang-Jiuh Wu, Hsinchu (TW); Wen-Chih Chiou, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 739 days.

(21) Appl. No.: 18/099,357

(22) Filed: Jan. 20, 2023

(65) Prior Publication Data

US 2024/0136199 A1 Apr. 25, 2024

Related U.S. Application Data

(60) Provisional application No. 63/417,797, filed on Oct. 20, 2022.

(51) Int. Cl.

| | |
|---|---|
| ***H10P 50/00*** | (2026.01) |
| ***H10P 72/00*** | (2026.01) |
| ***H10P 76/20*** | (2026.01) |
| ***H10P 76/40*** | (2026.01) |

(52) U.S. Cl.

CPC .......... *H10P 50/73* (2026.01); *H10P 72/0421* (2026.01); *H10P 72/0422* (2026.01); *H10P 76/204* (2026.01); *H10P 76/4085* (2026.01)

(58) Field of Classification Search

CPC ........... H01L 21/31144; H01L 21/0273; H01L 21/0337; H01L 21/67069; H01L 21/67075; H01L 21/7806

See application file for complete search history.

(56) References Cited

U.S. PATENT DOCUMENTS 4,246,595 A * 1/1981 Noyori ................ G02F 1/13452 257/668
2022/0314357 A1* 10/2022 Nishimura ............. B23K 10/02

* cited by examiner

*Primary Examiner* — Fernando L Toledo
*Assistant Examiner* — Jorge Andres Lopez
(74) *Attorney, Agent, or Firm* — Birch, Stewart, Kolasch & Birch, LLP

(57) ABSTRACT

A semiconductor device and a semiconductor manufacturing method thereof are provided. The semiconductor manufacturing method includes the following streps. A first semiconductor element with a first bonding film is formed. The first bonding film is formed on a first side of the first semiconductor element. The first semiconductor element and the first bonding film form a taper structure. The first bonding film forms a wide portion of the taper structure. The first semiconductor element forms a narrow portion of the taper structure. A second semiconductor element with a second bonding film is formed. The second bonding film is formed on the second semiconductor element. The first semiconductor element and the second semiconductor element are bonded by bonding the first bonding film and the second bonding film. An oxide layer is filled to surround the first semiconductor element and the first bonding film.

20 Claims, 6 Drawing Sheets

180
163
160
150
153
TP
TPn
TPw
150a

SEMICONDUCTOR DEVICE AND SEMICONDUCTOR MANUFACTURING METHOD THEREOF

PRIORITY CLAIM AND CROSS-REFERENCE

This application claims the benefit of U.S. provisional application Ser. No. 63/417,797, filed Oct. 20, 2022, the subject matter of which is incorporated herein by reference.

BACKGROUND

The disclosure relates in general to a device and a manufacturing method thereof and more particularly to a semiconductor device and a semiconductor manufacturing method thereof.

With the development of semiconductor technology, chip bonding technology has been developed. A chip could be bounded on a wafer or another chip. However, a re-entrant corner often exists at the edge of the chip. It is difficult to fill material in re-entrant corner.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
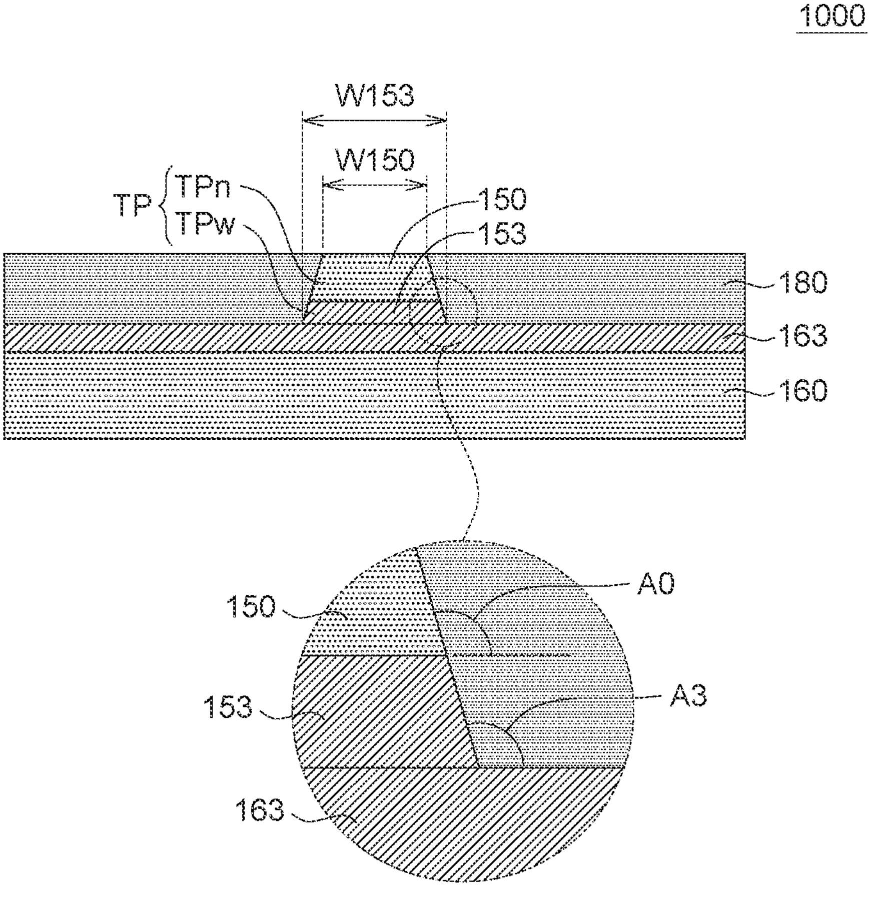
FIG. 1 shows a semiconductor device according to one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Please refer to FIG. 1, which shows a semiconductor device 1000 according to one embodiment. The semiconductor device 1000 includes a semiconductor element 150, a bonding film 153, a semiconductor element 160, a bonding film 163 and an oxide layer 180. The semiconductor element 150 is, for example, a chips. The semiconductor element 160 is, for example, a wafer. The bonding film 153 is formed on the semiconductor element 150. The bonding film 163 is formed on the semiconductor element 160. The bonding film 153 is bonded to the bonding film 163. The semiconductor element 150 and the bonding film 153 form a taper structure TP. The bonding film 153 forms a wide portion TPw of the taper structure TP, and the semiconductor element 150 forms a narrow portion TPn of the taper structure TP. The oxide layer 180 surrounds the semiconductor element 150 and the bonding film 153.

The edge of the taper structure TP is friendly for filling material, so the quality of the oxide layer 180 could be improved. In particular, as shown in FIG. 1, a width W150 of the semiconductor element 150 is less than a width W153 of the bonding film 153. The semiconductor element 150 located above the bonding film 153 would not block filling the material at the edge of the bonding film 153.

In one embodiment, the width W150 of the semiconductor element 150 is gradually increased towards the bonding film 153, so the sidewall of the semiconductor element 150 is an inclined plane.

Moreover, the width W153 of the bonding film 153 is gradually increased towards the bonding film 163, so the sidewall of the bonding film 153 is also an inclined plane.

An angle A3 between a sidewall of the bonding film 153 and a surface of the bonding film 163 is, for example, between 95 degrees to 115 degrees. Also, an angle A0 between a sidewall of the semiconductor element 150 and a virtual plane which is parallel to the surface of the bonding film 163 is, for example, between 95 degrees and 115 degrees.

Based on above, any re-entrant corner would not exist at the sidewall of the bonding film 153 or the sidewall of the semiconductor element 150. Filling material to surround the bonding film 153 and the semiconductor element 150 is easier and a robust process window can be provided.

Figure 2:
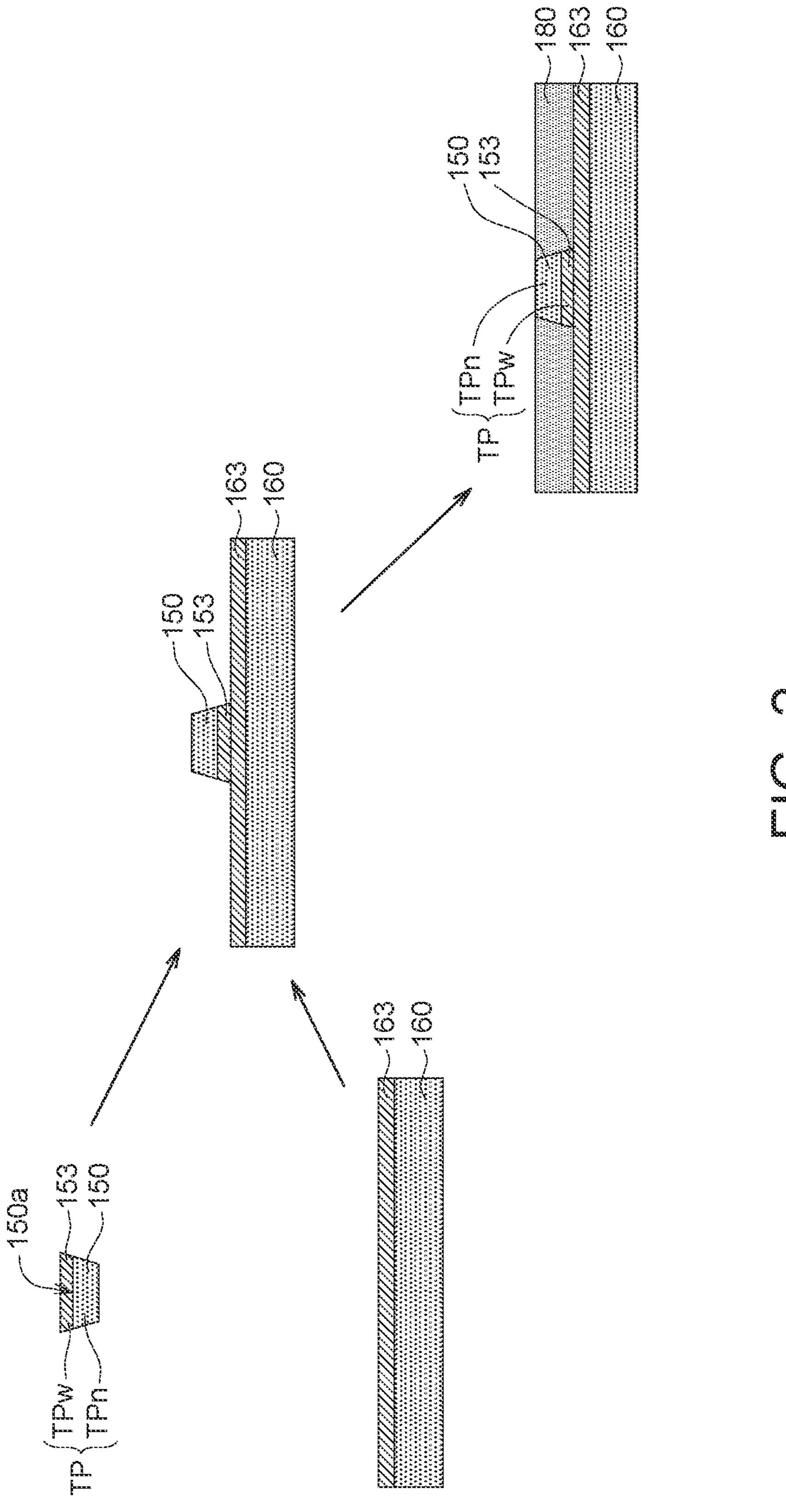
FIG. 2 illustrates a manufacturing method of the semiconductor device of FIG.

Please refer to FIG. 2, which illustrates a manufacturing method of the semiconductor device 1000 of FIG. 1. As shown in the upper left drawing of FIG. 2, the semiconductor element 150 with the bonding film 153 is formed. The bonding film 153 is formed on a first side 150*a* of the semiconductor element 150. The semiconductor element 150 and the bonding film 153 form the taper structure TP. The bonding film 153 forms the wide portion TPw of the taper structure TP. The semiconductor element 150 forms the narrow portion TPn of the taper structure TP.

As shown in the lower left drawing of FIG. 2, the semiconductor element 160 with the bonding film 163 is formed. The bonding film 163 is formed on the semiconductor element 160.

As shown in the right drawings of FIG. 2, the semiconductor element 150 and the semiconductor element 160 are bonded by bonding the bonding film 153 and the bonding film 163.

Then, the oxide layer 180 is filled to surround the semiconductor element 150 and the bonding film 153. Due to the tapper structure TP, any re-entrant corner would not exist at the sidewall of the bonding film 153 or the sidewall of the semiconductor element 150. Filling material to surround the bonding film 153 and the semiconductor element 150 is easier and the robust process window can be provided.

Figure 3:
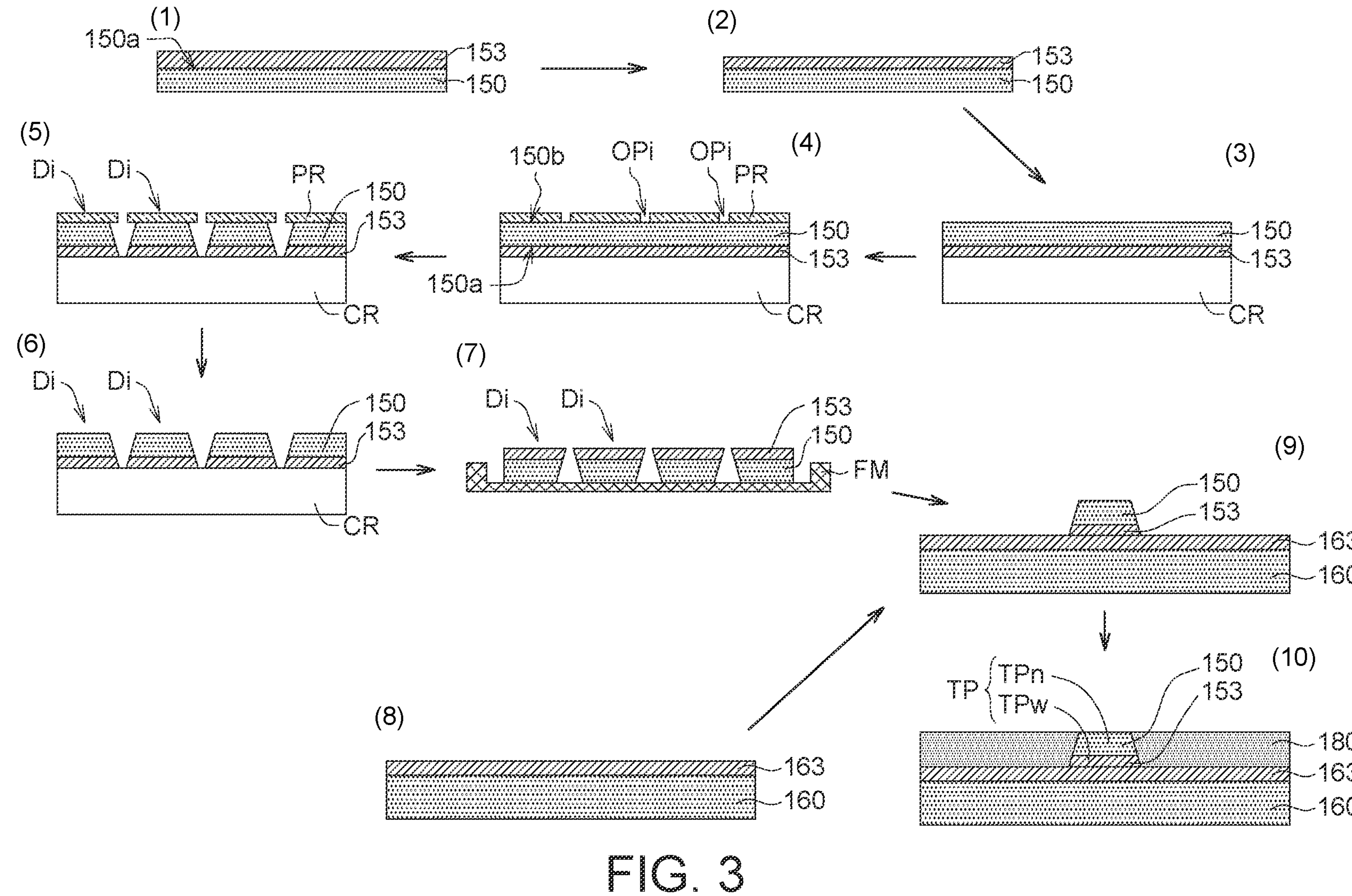
FIG. 3 illustrates detail steps of FIG. 2.

Please refer to FIG. 3, which illustrates detail steps of FIG. 2. The drawings in FIG. 3 are labeled as "(1)" to "(10)". As shown in the drawing labeled as "(1)" of FIG. 3, the bonding film 153 is formed on the first side 150*a* of the semiconductor element 150. The bonding film 153 is, for example, formed by disposition.

Then, as shown in the drawing labeled as "(2)" of FIG. 3, the bonding film 153 is grinded by chemical mechanical polishing (CMP). In one embodiment, this step could be omitted.

Next, as shown in the drawing labeled as "(3)" of FIG, 3, the semiconductor element 150 and the bonding film 153 are turned over and carried by a temporary carrier CR, for example a tape.

Afterwards, as shown in the drawing labeled as "(4)" of FIG. 3, a photoresist film PR having a plurality of openings OPi is formed on a second side 150*b* of the semiconductor element 150.

Then, as shown in the drawing labeled as "(5)" of FIG. 3, the semiconductor element 150 and the bonding film 153 are etched by using the photoresist film PR as a mask. For example, the semiconductor element 150 and the bonding film 153 could be etched by a dry etching process or a wet etching process. As shown in the drawing, the bonding film 153 is etched after the semiconductor element 150 is etched. That is to say, the semiconductor element 150 is etched more, and a V cut could be formed after etching.

In one embodiment, a chip singulation process is performed by the step of etching the semiconductor element 150 and the bonding film 153 to obtain a plurality of chips Di.

Next, as shown in the drawing labeled as "(6)" of FIG. 3, the photoresist film PR is removed.

Then, as shown in the drawing labeled as "(7)" of FIG. 3, the temporary carrier CR is removed, and the chips I)i are placed on a dicing frame FM.

Moreover, as shown in the drawing labeled as "(8)" of FIG, 3, the bonding film 163 is formed on the semiconductor element 160. The bonding film 163 is, for example, formed by disposition.

Next, as shown in the drawing labeled as "(9)" of FIG. 3, the semiconductor element 150 is bounded on the semiconductor element 160 by bonding the bonding film 153 and the bonding film 163. After the semiconductor element 150 is bounded on the semiconductor element 160, an obtuse angle is formed between the sidewall of the bonding film 153 and the surface of the bonding film 163.

Then, as shown in the drawing labeled as "(10)" of FIG. 3, the oxide layer 180 is filled to surround the semiconductor element 150 and the bonding film 153. Due to the tapper structure TP, any re-entrant corner would not exist at the sidewall of the bonding film 153 or the sidewall of the semiconductor element 150. Filling material to surround the bonding film 153 and the semiconductor element 150 is easier and the robust process window can be provided.

Figure 4:
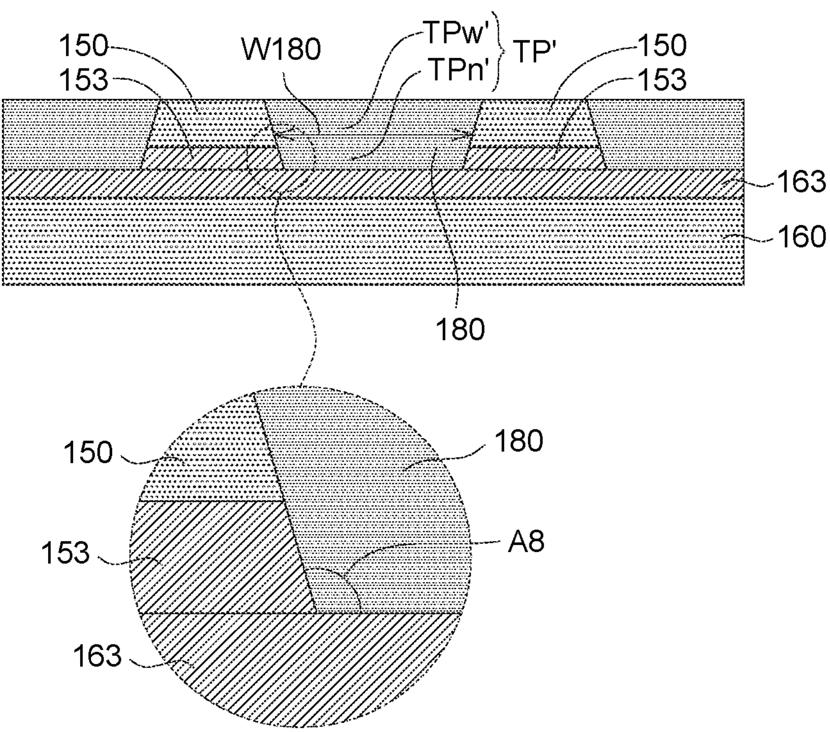
FIG. 4 shows a semiconductor device according to one embodiment.

Please refer to FIG. 4, which shows a semiconductor device 1000' according to one embodiment. The semiconductor device 1000' includes at least two semiconductor elements 150, at least two bonding films 153, a semiconductor element 160, a bonding film 163 and an oxide layer 180. The semiconductor elements 150 are, for example, chips. The semiconductor 160 is, for example, a wafer. The bonding films 153 are respectively formed on the semiconductor elements 150. The bonding films 153 are bonded to the bonding film 163. The oxide layer 180 is formed on the bonding film 163 and surrounds the semiconductor elements 150 and the bonding films 153. The oxide layer 180 located between the two semiconductor elements 150 and the two binding films 153 forms a taper structure TP', the semiconductor elements 150 contact a wide portion TPw' of the taper structure TP', and the bonding films 153 contact a narrow portion TPn' of the taper structure TP'.

The sidewall of the oxide layer 180 is tightly in contact with the sidewall of the bonding films 153 and the semiconductor elements 150. In particular, as shown in FIG. 4, a width W180 of the oxide layer 180 is gradually decreased towards the bonding film 163, so the sidewall of the oxide layer 180 is an inclined plan.

An angle A8 between the sidewall of the oxide layer 180 and the surface of the bonding film 163 is between 95 degrees and 115 degrees.

Based on above, any re-entrant corner does not exist at the sidewall of the bonding film 153 or the sidewall of the semiconductor element 150. The oxide layer 180 can be formed very well and the robust process window can be provided.

Figure 5:
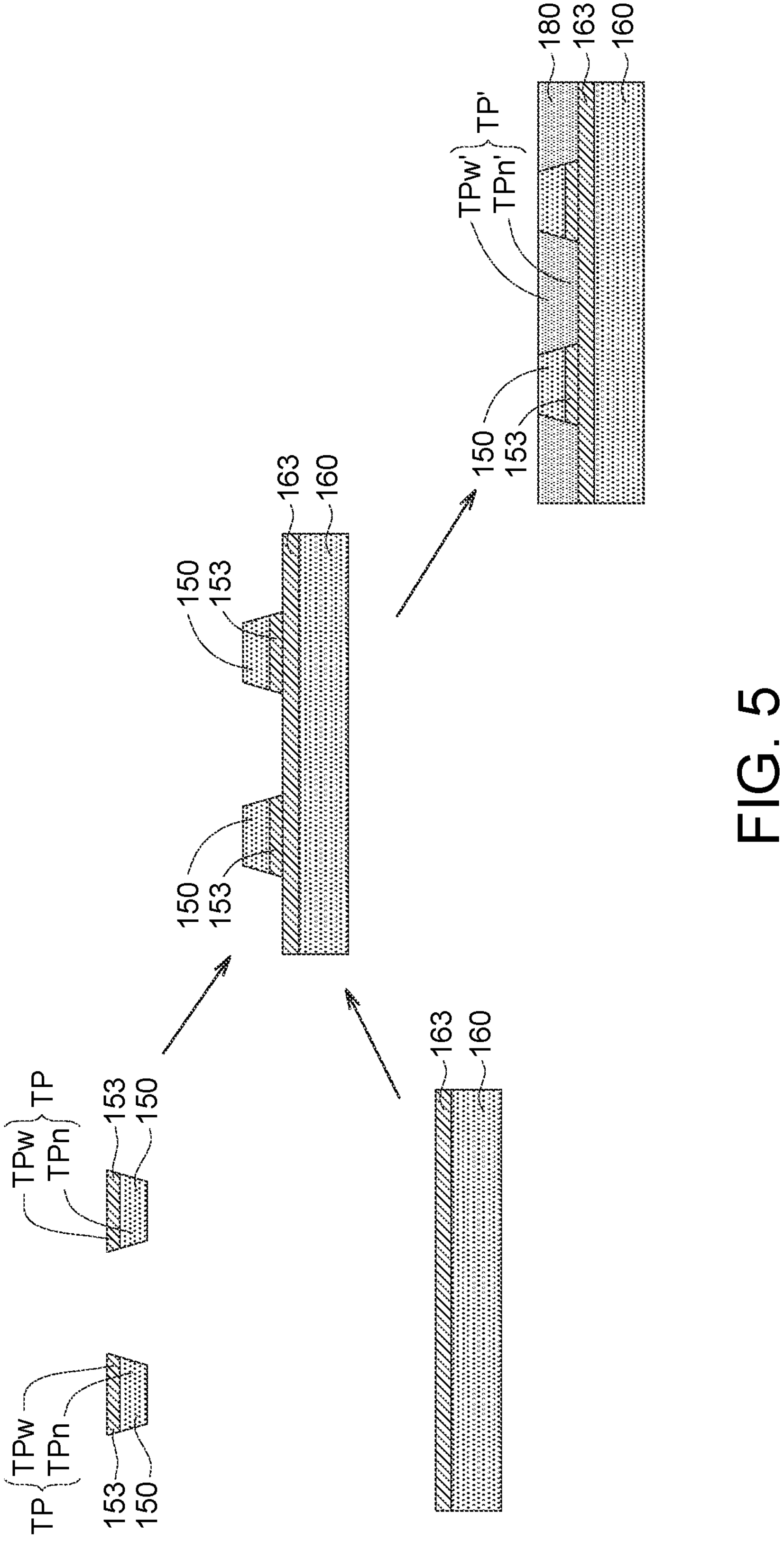
FIG. 5 illustrates a manufacturing method of the semiconductor device of FIG. 4.

Please refer to FIG. 5, which illustrates a manufacturing method of the semiconductor device 1000' of FIG. 4. As shown in the upper left drawing of FIG. 5, the semiconductor elements 150 with the bonding films 153 are formed. Each of the bonding films 153 is formed on a first side 150*a* of the corresponding semiconductor element 150. The semiconductor elements 150 and the bonding films 153 form the two taper structures TP. Each of the bonding films 153 forms the wide portion TPw of each of the taper structures TP. Each of the semiconductor elements 150 forms the narrow portion TPn of each of the taper structures TP.

As shown in the lower left drawing of FIG. 5, the semiconductor element 160 with the bonding film 163 is formed. The bonding film 163 is formed on the semiconductor element 160.

As shown in the right drawing of FIG. 5, the semiconductor elements 150 and the semiconductor element 160 are bonded by bonding the bonding films 153 and the bonding film 163.

Then, the oxide layer 180 is filled to surround the semiconductor elements 150 and the bonding films 153. Due to the tapper structure TP, any re-entrant corner would not exist at the sidewalk of the bonding films 153 or the sidewalk of the semiconductor elements 150. The oxide layer 180 formed between the two semiconductor elements 150 and the two bonding films 153 would become the taper structure TP'. Filling material to surround the bonding films 153 and the semiconductor elements 150 is easier and the robust process window can be provided.

Figure 6:
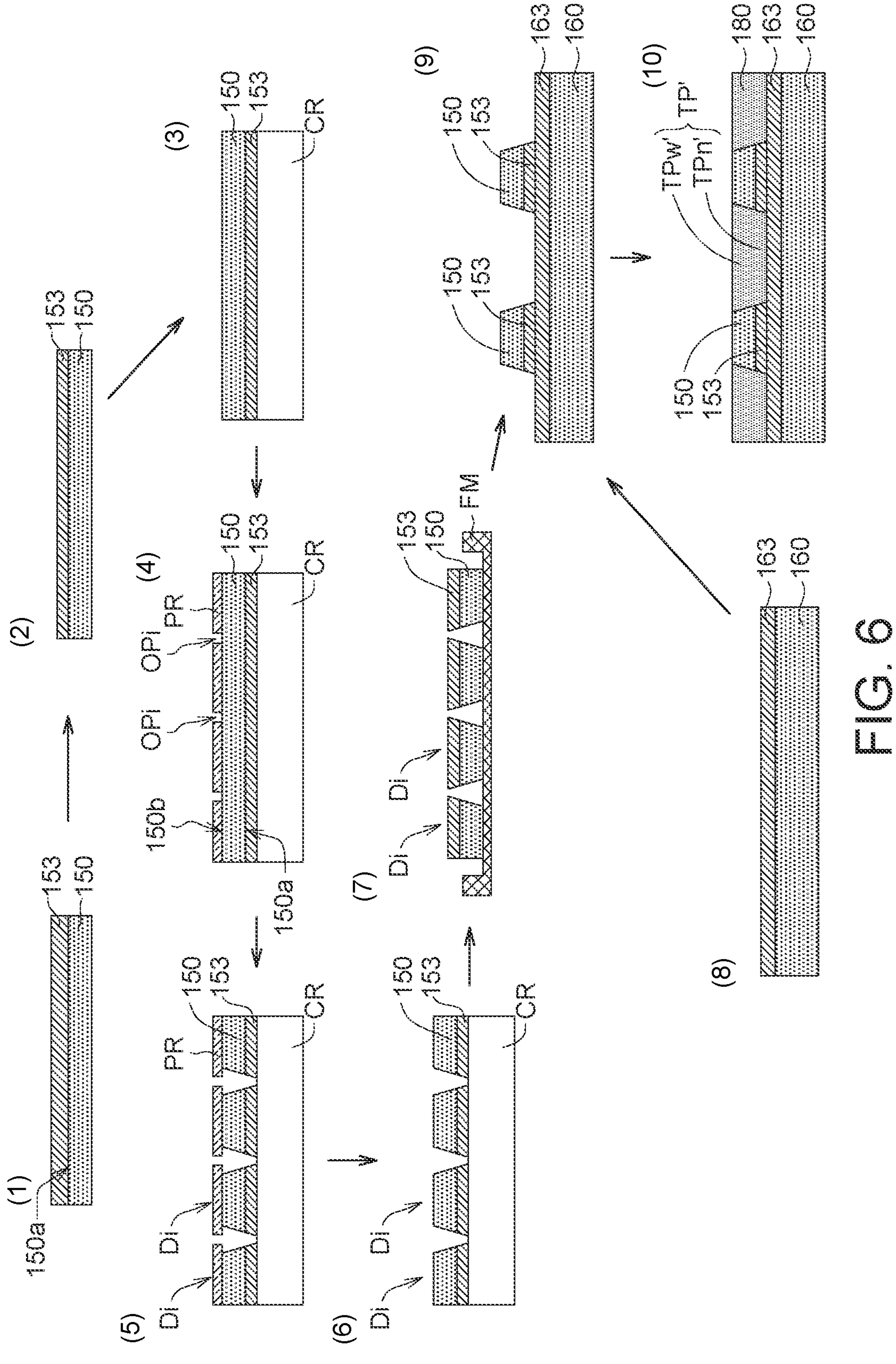
FIG. 6 illustrates detail steps of FIG. 5.

Please refer to FIG. 6, which illustrates detail steps of FIG. 5. The drawings in FIG. 6 are labeled as "(1)" to "(10)". As shown in the drawing labeled as "(1)" of FIG. 6, the bonding film 153 is formed on the first side 150*a* of the semiconductor element 150. The bonding film 153 is, for example, formed by disposition.

Then, as shown in the drawing labeled as "(2)" of FIG. 6, the bonding film 153 is grinded by chemical mechanical polishing (CMP). In one embodiment, this step could be omitted.

Next, as shown in the drawing labeled as "(3)" of FIG, 6, the semiconductor element 150 and the bonding film 153 are turned over and carried by the temporary carrier CR, for example a tape.

Afterwards, as shown in the drawing labeled as "(4)" of FIG. 6, the photoresist film PR having a plurality of openings OPi on the second side 150*b* of the semiconductor element 150.

Then, as shown in the drawing labeled as "(5)" of FIG. 6, the semiconductor element 150 and the bonding film 153 are etched by using the photoresist film PR as a mask. For example, the semiconductor element 150 and the bonding film 153 could be etched by a dry etching process or a wet etching process. As shown in the drawing, the bonding film 153 is etched after the semiconductor element 150 is etched. That is to say, the semiconductor element 150 is etched more, and a V cut could be formed after etching.

In one embodiment, a chip singulation process is performed by the step of etching the semiconductor element 150 and the bonding film 153 to obtain a plurality of chips Di.

Next, as shown in the drawing labeled as "(6)" of FIG. 6, the photoresi st film PR is removed.

Then, as shown in the drawing labeled as "(7)" of FIG. 6, the temporary carrier CR is removed, and the chips Di are placed on a dicing frame FM.

Moreover, as shown in the drawing labeled as "(8)" of FIG, 6, the bonding film 163 is formed on the semiconductor element 160. The bonding film 163 is, for example, formed by disposition.

Next, as shown in the drawing labeled as "(9)" of FIG. 6, the semiconductor elements 150 of at least two chips Di are bounded on the semiconductor element 160 by bonding the bonding films 153 and the bonding film 163. After the semiconductor elements 150 of the at least two chips Di are bounded on the semiconductor element 160, an obtuse angle is formed between the sidewall of each of the bonding films 153 and the surface of the bonding film 163.

Then, as shown in the drawing labeled as "(10)" of FIG. 6, the oxide layer 180 is filled to surround the semiconductor elements 150 and the bonding films 153 of the at least two chips Di. Due to the tapper structure TP, any re-entrant corner would not exist at the sidewall of the bonding film 153 or the sidewall of the semiconductor element 150. The oxide layer 180 can be formed very well and the robust process window can be provided.

According to the disclosure described above, the bonding film 153 (or the semiconductor element 150) is etched to be a taper profile, so any re-entrant corner would not exist at the sidewall of the bonding film 153 (or the sidewall of the semiconductor element 150). Filling material to surround the bonding film 153 and the semiconductor element 150 is easier and the robust process window can be provided.

According to one embodiment, a semiconductor manufacturing method is provided. The semiconductor manufacturing method includes the following streps. A first semiconductor element with a first bonding film is formed. The first bonding film is formed on a first side of the first semiconductor element. The first semiconductor element and the first bonding film form a taper structure. The first bonding film forms a wide portion of the taper structure. The first semiconductor element forms a narrow portion of the taper structure. A second, semiconductor element with a second bonding film is formed. The second bonding film is formed on the second semiconductor element. The first semiconductor element and the second semiconductor element are bonded by bonding the first bonding film and the second bonding film. An oxide layer is filled to surround the first semiconductor element and the first bonding film, According to another embodiment, a semiconductor device is provided. The semiconductor device includes a first semiconductor element, a first bonding film, a second semiconductor element, a second bonding film and an oxide layer. The first bonding film is formed on the first semiconductor element. The second bonding film is formed on the second semiconductor element. The first bonding film is bonded to the second bonding film. The first semiconductor element and the first bonding film form a taper structure. The first bonding film forms a wide portion of the taper structure. The first semiconductor element forms a narrow portion of the taper structure. The oxide layer surrounds the first semiconductor element and the first bonding film.

According to an alternative embodiment, a semiconductor device is provided. The semiconductor device includes two first semiconductor elements, two first bonding films, a second semiconductor element, a second bonding film and an oxide layer. The two first bonding films are respectively formed on the first semiconductor elements. The second bonding film is formed on the second semiconductor element. The first bonding film is bonded to the second bonding film. The oxide layer is formed between the two first semiconductor elements and the two first bonding films. The oxide layer forms a taper structure. The first semiconductor elements contact a wide portion of the taper structure. The first bonding films contact a narrow portion of the taper structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor manufacturing method, comprising:

forming a first semiconductor element with a first bonding film, wherein the first bonding film is formed on a first side of the first semiconductor element, the first semiconductor element and the first bonding film form a taper structure, the first bonding film forms a wide portion of the taper structure, the first semiconductor element forms a narrow portion of the taper structure, and the first semiconductor element and the first bonding film are etched in an identical etching process to form the taper structure;

forming a second semiconductor element with a second bonding film, wherein the second bonding film is formed on the second semiconductor element;

bonding the first semiconductor element and the second semiconductor element by bonding the first bonding film and the second bonding film; and filling an oxide layer to surround the first semiconductor element and the first bonding film.

2. The semiconductor manufacturing method according to claim 1, wherein the step of forming the first semiconductor element with the first bonding film includes:

forming a photoresist film having a plurality of openings on a second side, opposite to the first side, of the first semiconductor element;

etching the first semiconductor element and the first bonding film by using the photoresist film as a mask; and removing the photoresist film.

3. The semiconductor manufacturing method according to claim 2, wherein the first semiconductor element and the first bonding film are etched by a dry etching process.

4. The semiconductor manufacturing method according to claim 2, wherein the first semiconductor element and the first bonding film are etched by a wet etching process.

5. The semiconductor manufacturing method according to claim 2, wherein the first bonding film is etched after the first semiconductor element is etched.

6. The semiconductor manufacturing method according to claim 2, wherein a chip singulation process is performed by the step of etching the first semiconductor element and the first bonding film.

7. A semiconductor manufacturing method, comprising:

forming a first semiconductor element with a first bonding film, wherein the first bonding film is formed on a first side of the first semiconductor element, a width of the first semiconductor element is less than that of the first bonding film, and the first semiconductor element and the first bonding film are etched in an identical etching process to form the taper structure;

forming a second semiconductor element with a second bonding film, wherein the second bonding film is formed on the second semiconductor element;

bonding the first semiconductor element and the second semiconductor element by bonding the first bonding film and the second bonding film; and filling an oxide layer to surround the first semiconductor element and the first bonding film.

8. The semiconductor manufacturing method according to claim 7, wherein the step of forming the first semiconductor element with the first bonding film includes:

forming a photoresist film having a plurality of openings on a second side, opposite to the first side, of the first semiconductor element;

etching the first semiconductor element and the first bonding film by using the photoresist film as a mask; and removing the photoresist film.

9. The semiconductor manufacturing method according to claim 8, wherein the first semiconductor element and the first bonding film are etched by a dry etching process.

10. The semiconductor manufacturing method according to claim 8, wherein the first semiconductor element and the first bonding film are etched by a wet etching process.

11. The semiconductor manufacturing method according to claim 8, wherein the first bonding film is etched after the first semiconductor element is etched.

12. The semiconductor manufacturing method according to claim 8, wherein a chip singulation process is performed by the step of etching the first semiconductor element and the first bonding film.

13. The semiconductor manufacturing method according to claim 7, wherein the first semiconductor element is a chip, and the second semiconductor element is a wafer.

14. A semiconductor manufacturing method, comprising:

forming a first semiconductor element with a first bonding film, wherein the first bonding film is formed on a first side of the first semiconductor element, a width of the first semiconductor element is gradually increased towards the first bonding film, and the first semiconductor element and the first bonding film are etched in an identical etching process to form the taper structure;

forming a second semiconductor element with a second bonding film, wherein the second bonding film is formed on the second semiconductor element;

bonding the first semiconductor element and the second semiconductor element by bonding the first bonding film and the second bonding film; and filling an oxide layer to surround the first semiconductor element and the first bonding film.

15. The semiconductor manufacturing method according to claim 14, wherein the step of forming the first semiconductor element with the first bonding film includes:

forming a photoresist film having a plurality of openings on a second side, opposite to the first side, of the first semiconductor element;

etching the first semiconductor element and the first bonding film by using the photoresist film as a mask; and removing the photoresist film.

16. The semiconductor manufacturing method according to claim 15, wherein the first semiconductor element and the first bonding film are etched by a dry etching process.

17. The semiconductor manufacturing method according to claim 15, wherein the first semiconductor element and the first bonding film are etched by a wet etching process.

18. The semiconductor manufacturing method according to claim 15, wherein the first bonding film is etched after the first semiconductor element is etched.

19. The semiconductor manufacturing method according to claim 15, wherein a chip singulation process is performed by the step of etching the first semiconductor element and the first bonding film.

20. The semiconductor manufacturing method according to claim 14, wherein the first semiconductor element is a chip, and the second semiconductor element is a wafer.

* * * * *